(12) United States Patent
Xiao

(10) Patent No.: US 11,049,949 B2
(45) Date of Patent: Jun. 29, 2021

(54) GATE-ALL-AROUND GRADIENT-DOPED NANO-SHEET COMPLEMENTARY INVERTER AND METHOD OF MAKING THE SAME

(71) Applicant: SiEn (QingDao) Integrated Circuits Co., Ltd, Shangdong (CN)

(72) Inventor: Deyuan Xiao, Shanghai (CN)

(73) Assignee: SiEn (QingDao) Integrated Circuits Co., Ltd., Qingdao (CN)

( * ) Notice: Subject to any disclaimer, the term of this patent is extended or adjusted under 35 U.S.C. 154(b) by 0 days.

(21) Appl. No.: 16/554,537

(22) Filed: Aug. 28, 2019

(65) Prior Publication Data

US 2020/0105893 A1 Apr. 2, 2020

(30) Foreign Application Priority Data

Sep. 28, 2018 (CN) .......................... 201811134875.5

(51) Int. Cl.
*H01L 29/423* (2006.01)
*H01L 29/786* (2006.01)
(Continued)

(52) U.S. Cl.
CPC ............... *H01L 29/42392* (2013.01); *H01L 21/823807* (2013.01); *H01L 21/84* (2013.01);
(Continued)

(58) Field of Classification Search
CPC ................. H01L 29/42392; H01L 21/823807
See application file for complete search history.

(56) References Cited

U.S. PATENT DOCUMENTS 8,350,298 B2 1/2013 Xiao et al.
9,136,336 B2 * 9/2015 Heo .................... H01L 29/1606
(Continued)

OTHER PUBLICATIONS

Taiwanese Office Action, dated Nov. 14, 2019, in a counterpart Taiwanese patent application, No. TW 108127971.

*Primary Examiner* — Farun Lu
(74) *Attorney, Agent, or Firm* — Chen Yoshimura LLP

(57) ABSTRACT

The present invention provides a gate-all-around quantum gradient-doped nano-sheet complementary inverter may comprise a P-type field effect transistor (FET) and an N-type FET. The P-type FET may comprise a P-type semiconductor nano-sheet channel, a first gate dielectric layer fully surrounding the P-type semiconductor nano-sheet channel, a first gate layer, and a source and a gate area, arranged at two ends of the channel. The N-type FET may comprise an N-type semiconductor nano-sheet channel, a second gate dielectric layer fully surrounding the N-type semiconductor nano-sheet channel, a second gate layer, and a source and a gate area, arranged at two ends of the channel. A common gate electrode may be arranged to fully surround the first and second gate layers. The doping concentration of the P-type and N-type semiconductor nano-sheet channels, which are arranged laterally, side by side, may be in gradient descent from the surface to the center. The width of the P-type semiconductor nano-sheet channel may be greater than that of the N-type semiconductor nano-sheet channel. The structure of the disclosed device may be dense enough to increase the density and improve the performance and simple enough to produce.

8 Claims, 9 Drawing Sheets

(51) Int. Cl.
*H01L 21/84* (2006.01)
*H01L 21/8238* (2006.01)
*H01L 27/12* (2006.01)
*H01L 29/10* (2006.01)
*H01L 29/775* (2006.01)
*H01L 29/06* (2006.01)
*H01L 29/66* (2006.01)
*H01L 27/092* (2006.01)
*H01L 27/06* (2006.01)
*H01L 29/16* (2006.01)

(52) U.S. Cl.
CPC ........ *H01L 27/0688* (2013.01); *H01L 27/092* (2013.01); *H01L 27/1203* (2013.01); *H01L 29/0673* (2013.01); *H01L 29/1045* (2013.01); *H01L 29/66439* (2013.01); *H01L 29/775* (2013.01); *H01L 29/78696* (2013.01); *H01L 29/1608* (2013.01)

(56) References Cited

U.S. PATENT DOCUMENTS

| | | |
|---|---|---|
| 2016/0035886 A1 | 2/2016 | Chen et al. |
| 2017/0133279 A1 | 5/2017 | Peng |
| 2017/0148787 A1 | 5/2017 | Obradovic et al. |
| 2017/0256461 A1* | 9/2017 | Xiao .................... H01L 21/0262 |
| 2019/0393350 A1* | 12/2019 | Thompson .......... H01L 29/7855 |
| 2020/0035567 A1* | 1/2020 | Chanemougame ......................... H01L 21/823807 |

\* cited by examiner

GATE-ALL-AROUND GRADIENT-DOPED NANO-SHEET COMPLEMENTARY INVERTER AND METHOD OF MAKING THE SAME

FIELD OF THE INVENTION

The present invention generally relates to a semiconductor device. Specifically, the device of gate-all-around (GAA) gradient-doped nano-sheet complementary inverter and method of making the same are disclosed.

BACKGROUND OF THE INVENTION

FinFET is a kind of field effect transistor (FET) with vertical fin-like structure. The 3D fin-like structure may form three gates to promote the power and efficiency. Current 14 nm and 10 nm chips and even the developing 7 nm chips which are just in test run phase are applied such FinFET chips for power supply. Recently, the FinFET chips are applied in servers, computers and systems, and they will be dominant in the future couple years.

The U.S. Pat. No. 8,350,298B2, entitled "HYBRID MATERIAL INVERSION MODE GAA CMOSFET," disclosed a GAA CMOS FET with mixed material. The cross section shape of the PMOS and NMOS channels in such transistor is like a track of a stadium, and the gate fully surrounds the surface of the PMOS or NMOS channels. Such GAA transistors show higher carrier mobility and prevent from poly depletion effect and short channel effect.

The GAA transistor of 5 nm node may be formed by horizontally stacking silicon nano-sheets to promote required power and performance for future application. The forth "gate" is opened by the vertical structure changed to the horizontal silicon layers. Then, electrical signals may be transmitted between transistors by passing across other transistors on the chip. This means the signals pass a switch which width is not wider than the width of two to three DNA chains. Therefore, such characteristic may be used for development of a solution to devices served as nodes greater than 5 nm.

In 2017 Symposia on VLSI Technology & Circuits, held in Kyoto, a novel transistor chip served as 5 nm node was made public. The best process was applied to stacking silicon nano-sheets of the transistor. The gate surrounding the transistor may carry out about 300 billion switches in a chip which size is about a nail. Therefore, such chip shows significant improvement on power and performance.

However, how to further increase density of device, power and performance in the practical manufacture process is the problem to be solved for technical researchers.

SUMMARY OF THE INVENTION

In light of current technology, one aspect of the present invention is to provide a device of gate-all-around (GAA) gradient-doped nano-sheet complementary inverter and method of making the same with performance improvement.

To carry out one of above-mentioned or other object, an embodiment of the invention is to provide a GM gradient-doped nano-sheet complementary inverter, comprising a substrate, a P-type field effect transistor (FET) and an N-type FET on the substrate, the P-type FET comprising a P-type semiconductor nano-sheet channel on the substrate, a first gate dielectric layer fully surrounding the P-type semiconductor nano-sheet channel, a first gate layer fully surrounding the first gate dielectric layer, and a first source area and a first drain area arranged at two ends of the P-type semiconductor nano-sheet channel, the N-type FET comprising an N-type semiconductor nano-sheet channel on the substrate, a second gate dielectric layer fully surrounding the N-type semiconductor nano-sheet channel, a second gate layer fully surrounding the second gate dielectric layer, and a second source area and a second drain area arranged at two ends of the N-type semiconductor nano-sheet channel; and a common gate electrode, connecting the first gate layer and the second gate layer and fully surrounding the first gate layer and the second gate layer, wherein the P-type semiconductor nano-sheet channel and N-type semiconductor nano-sheet channel, arranged laterally, side by side, have a width and a length, along a horizontal direction, and a height, perpendicular to the horizontal direction, the length of the P-type semiconductor nano-sheet channel defines the distance between the first source area and the first drain area, the length of the N-type semiconductor nano-sheet channel defines the distance between the second source area and the second drain area, the width of the P-type semiconductor nano-sheet channel is greater than that of the N-type semiconductor nano-sheet channel, and a doping concentration of the P-type semiconductor nano-sheet channel and the N-type semiconductor nano-sheet channel is in gradient descent from the surface to the center.

Optionally, the first source area may connect to a power source, the first drain area may connect to the second drain to serve as an output end, the second source area may connect to ground, and the common gate electrode may be served as an input end.

Optionally, a cross-section profile of the P-type semiconductor nano-sheet channel and N-type semiconductor nano-sheet channel along with the width may be like a track roughly which may comprise two semicircles at two ends and a rectangle connecting to the semicircles in the center.

Optionally, the P-type semiconductor nano-sheet channel may be applied with P-type silicon nano-sheet and N-type semiconductor nano-sheet channel may be applied with N-type silicon nano-sheet.

Optionally, the P-type FET may comprise a plurality of P-type semiconductor nano-sheet channels, arranged vertically, and the N-type FET may comprise a plurality of N-type semiconductor nano-sheet channels, arranged vertically.

Optionally, the first source area and the first drain may be applied with P-type SiGe, and the second source area and the second drain may be applied with N-type SiC.

Optionally, a dielectric layer may be formed between the first source area and the first drain area, the first gate layer and the common gate electrode, the second source area and the second drain area, and the second gate layer and the common gate electrode.

Optionally, an insulation layer may be formed under the P-type FET and the N-type FET to insulate the substrate.

To carry out one of above-mentioned or other object, an embodiment of the invention is to provide a method of making a GAA gradient-doped nano-sheet complementary inverter, comprising steps of: providing a substrate; forming a stack of sacrificial layer and semiconductor nano-sheets on the substrate, both of which are layered alternately; defining at least two channel areas having different widths but arranged side by side, etching the stack to form two sets of semiconductor nano-sheets having different widths, arranged side by side and corresponding to the two channel areas respectively, and removing the sacrificial layer underneath the semiconductor nano-sheets to expose rim of the semiconductor nano-sheets and suspend the semiconductor nano-sheets above the substrate; doping the two sets of semiconductor nano-sheets with ionized dopant to form gradient-doped P-type semiconductor nano-sheet channel and gradient-doped N-type semiconductor nano-sheet channel, wherein the doping concentration of the P-type semiconductor nano-sheet channel and N-type semiconductor nano-sheet channel are in gradient descent from the surface to the center, and the width of the P-type semiconductor nano-sheet channel is greater than that of the N-type semiconductor nano-sheet channel; forming a first gate dielectric layer fully surrounding the P-type semiconductor nano-sheet channel and a first gate layer fully surrounding the first gate dielectric layer on the P-type semiconductor nano-sheet channel, and a second gate dielectric layer fully surrounding the N-type semiconductor nano-sheet channel and a second gate layer fully surrounding the second gate dielectric layer on the N-type semiconductor nano-sheet channel; forming a common gate electrode, fully surrounding the first gate layer and the second gate layer; and forming the first source area and the first drain area at the two ends of the P-type semiconductor nano-sheet channel, and the second source area and the second drain area at the two ends of the N-type semiconductor nano-sheet channel.

Optionally, the stack may be epitaxial-grown on the substrate, the sacrificial layer may be an epitaxial-grown SiGe layer, and the semiconductor nano-sheets may be epitaxial-grown Si layers on the sacrificial layer.

Optionally, the method may further comprise an oxidation process and then a wet-etching process to form rounded corners of the semiconductor nano-sheets after removing the sacrificial layer under the semiconductor nano-sheets. Further, the method may comprise a helium annealing process applied on the semiconductor nano-sheets after the oxidation process and then the wet-etching process to form the rounded corners of the semiconductor nano-sheets.

Optionally, the step of forming gradient-doped P-type semiconductor nano-sheet channel may further comprise depositing heavily boron-doped boron-silicate glass (BSG) on the surface of the semiconductor nano-sheets, performing an annealing and diffusing process and removing the BSG.

Optionally, the step of forming gradient-doped N-type semiconductor nano-sheet channel may further comprise depositing heavily phosphorus-or-arsenic-doped phosphorus-silicate glass (PSG) on the surface of the semiconductor nano-sheets, performing an annealing and diffusing process and removing the PSG.

Optionally, the first source area and the first drain area may be epitaxial-grown areas at two ends of the P-type semiconductor nano-sheet channel, and the second source area and the second drain area may be epitaxial-grown areas at two ends of the N-type semiconductor nano-sheet channel.

Optionally, the first source area and the first drain area may be made by P-type SiGe, and the second source area and the second drain area may be made by N-type SiC.

Optionally, a step of forming a shallow trench isolation structure on the substrate and a step of forming an insulation layer on the substrate may be performed.

Optionally, the GAA gradient-doped nano-sheet complementary inverter and method for making a GAA gradient-doped nano-sheet complementary inverter disclosed here may bring benefits as follows: GAA is formed with the 3D structure of the stacked semiconductor nano-sheets and the channel fully surrounded by the gate. The device is compact because the common gate electrode may surround several channels at the same time. Then, with the channels of pEFT and nEFT being arranged side by side and channel width of pEFT being greater than that of nEFT, a denser and balanced invertor may carry out. The channels with gradient-doped, which doping concentration is in gradient descent from the surface to the center, may facilitate a better performance of turning-off and lower current leakage and power consumption. Besides, the cross-section profile of the channel may be like a track to increase cross-sectional area of the channel, as well as driving current, and meanwhile sustain electrical integrity of the device.

Compared with current technology, the device disclosed here is compact and beneficial to increase density and performance with simple structure and therefore the device is easier to make.

BRIEF DESCRIPTION OF THE DRAWINGS

Various objects and advantages of the present invention will be more readily understood from the following detailed description when read in conjunction with the appended drawing, in which:

FIGS. 1a-1b show a diagram of a gate-all-around (GAA) gradient-doped nano-sheet complementary inverter according to an embodiment of the invention, in which FIG. 1a is a top view and FIG. 1b is a cross-section view along AA' direction indicated in FIG. 1a;

DESCRIPTION OF EMBODIMENTS OF THE INVENTION

For a more complete understanding of the present disclosure and its advantages, reference is now made to the following description taken in conjunction with the accompanying drawings, in which like reference numbers indicate like features. Persons having ordinary skill in the art will understand other varieties for implementing example embodiments, including those described herein. The drawings are not limited to specific scale and similar reference numbers are used for representing similar elements. As used in the disclosures and the appended claims, the terms "example embodiment," "exemplary embodiment," and "present embodiment" do not necessarily refer to a single embodiment, although it may, and various example embodiments may be readily combined and interchanged, without departing from the scope or spirit of the present disclosure.

It is to be understood that these embodiments and drawings are not meant as limitations of the invention but merely exemplary descriptions of the invention with regard to certain specific embodiments. Indeed, different numbers, shapes and sizes of elements may be apparent to those skilled in the art without departing from the scope of the annexed claims.

Figure 1A:
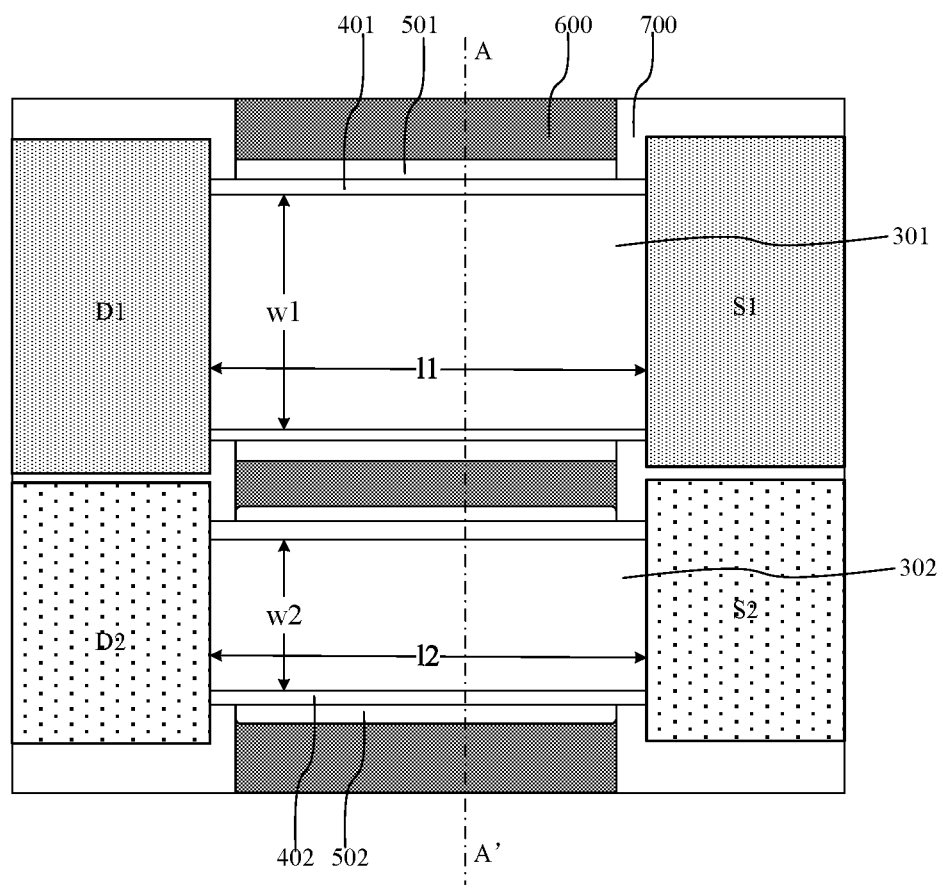
Figure 1B:
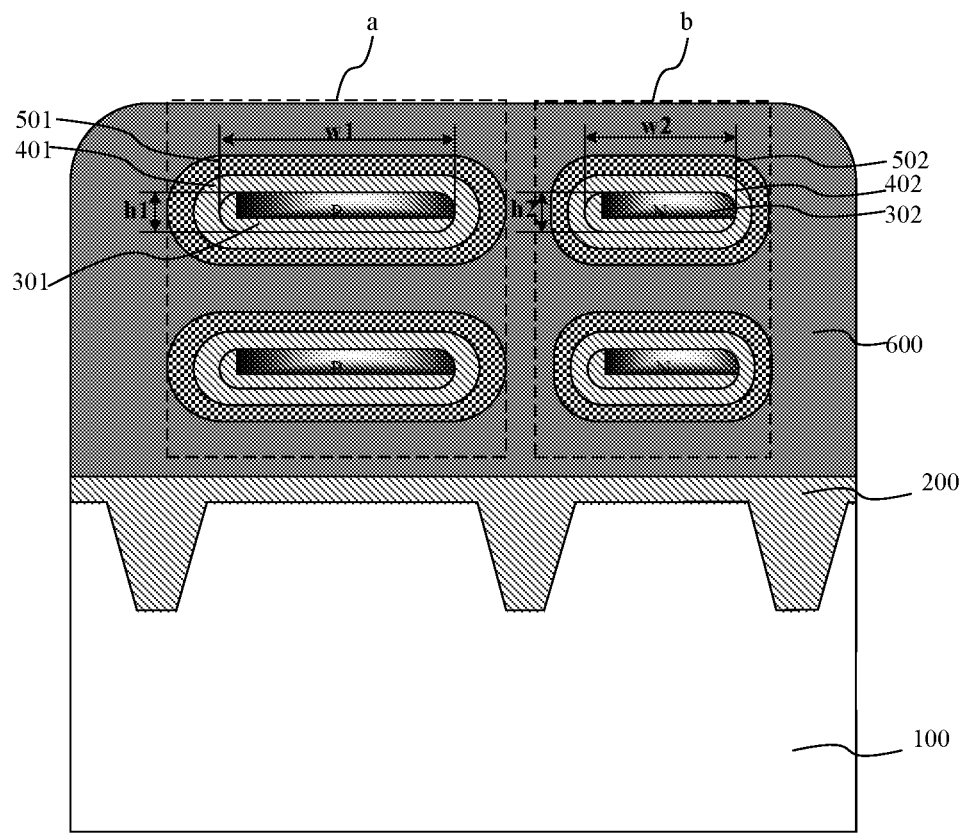

Please refer to FIGS. 1a and 1b, which show a diagram of a gate-all-around (GAA) gradient-doped nano-sheet complementary inverter according to an embodiment of the invention. The GAA gradient-doped nano-sheet complementary inverter comprises a substrate 100, a P-type field effect transistor (FET) a, an N-type FET b, and a common gate electrode 600, on the substrate 100. FIG. 1a is a top view and FIG. 1b is a cross-section view along AA' direction indicated in FIG. 1a.

The substrate 100 may be a typical bulk silicon substrate or other proper semiconductor substrate. On the substrate 100, an insulation layer 200 is arranged to insulate the P-type FET a and the N-type FET b.

The P-type FET a and the N-type FET b both are GAA non-planar transistor. The structure are basically the same. The P-type FET a may comprise a P-type semiconductor nano-sheet channel 301, a first gate dielectric layer 401 fully surrounding the P-type semiconductor nano-sheet channel 301, a first gate layer 501 fully surrounding the first gate dielectric layer 401, and a first source area S1 and a first drain area D1 oppositely arranged at two ends of the P-type semiconductor nano-sheet channel 301. The N-type FET b may comprise an N-type semiconductor nano-sheet channel 302, a second gate dielectric layer 402 fully surrounding the N-type semiconductor nano-sheet channel 302, a second gate layer 502 fully surrounding the second gate dielectric layer 402, and a second source area S2 and a second drain area D2 oppositely arranged at two ends of the N-type semiconductor nano-sheet channel 302.

The common gate electrode 600 fully surrounds the first gate layer 501 and the second gate layer 502 to connect the first gate layer 501 with the second gate layer 502.

Specifically, the P-type semiconductor nano-sheet channel 301 may be arranged laterally with the N-type semiconductor nano-sheet channel 302, side by side. The P-type semiconductor nano-sheet channel 301 may have a width w1 and a length l1, both of which are along with a horizontal direction, and a height h1 perpendicular to the horizontal direction. The length l1 of the P-type semiconductor nano-sheet channel 301 may define the distance between the first source area S1 and the first drain area D1. The N-type semiconductor nano-sheet channel 302 may have a width w2 and a length l2, both of which are along with a horizontal direction, and a height h2 perpendicular to the horizontal direction. The length l2 of the N-type semiconductor nano-sheet channel 302 may define the distance between the second source area S2 and the second drain area D2. The width w1 of the P-type semiconductor nano-sheet channel 301 may be greater than the width w2 of the N-type semiconductor nano-sheet channel 302. The height h1 may be basically the same as the height h2, such as 10-100 nm. Along the width w1/w2, a cross-section profile of the P-type semiconductor nano-sheet channel 301 and N-type semiconductor nano-sheet channel 302 may be like a track roughly, as shown in FIG. 1b, which comprises two semicircles at two ends and a rectangle connecting to the semicircles in the center. Such profile may increase the cross-sectional area of the channel to increase driving current and meanwhile sustain electrical integrity of the device. Because the mobility of the channel carriers, holes, of a pFET is much lower than that of the channel carriers, electrons, of a nFET, here the channel width of the pFET is wider than that of the nFET to form a more balanced CMOS.

Further, in the present invention, a doping concentration of the P-type semiconductor nano-sheet channel and the N-type semiconductor nano-sheet channel may be in gradient descent from the surface to the center. When the device is requested to be turned off, because the center of the channel is far from the surface, the electric field there is weaker and it is difficult to deplete the carriers. The doping concentration which is in gradient descent from the surface to the center may facilitate the turning-off of the device and lower current leakage and power consumption.

Specifically, the P-type semiconductor nano-sheet channel 301 may be applied with P-type silicon nano-sheet and the N-type semiconductor nano-sheet channel 302 may be applied with N-type silicon nano-sheet. The source and drain of the pEFT, i.e. the first source area S1 and the first drain D1, may be applied with epitaxial-grown P-type SiGe, and the source and drain of the nEFT, i.e. the second source area S2 and the second drain area D2 may be applied with N-type SiC. The source and drain of the pEFT may generate compression stress to increase the mobility of the carriers, holes. The source and drain of the nEFT may generate tension stress to increase the mobility of the carriers, electrons. A dielectric layer 700 may be formed between the first source area S1 and the first drain area D1, the first gate layer 501 and the common gate electrode 600, and the dielectric layer 700, as a spacer, may be also formed between the second source area S2 and the second drain area D2, and the second gate layer 502 and the common gate electrode 600.

Figure 2:
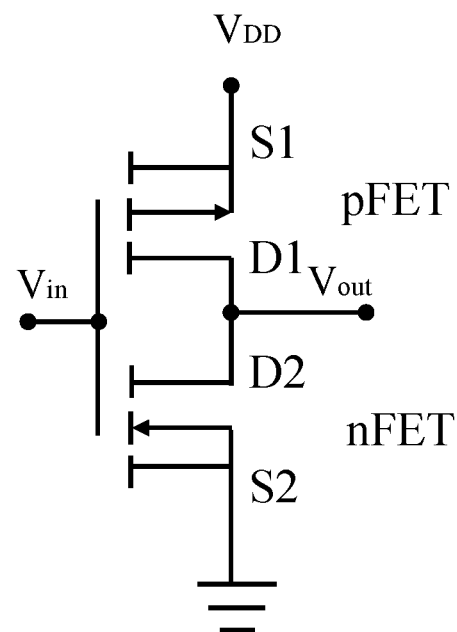
FIG. 2 shows a circuit diagram of a GAA gradient-doped nano-sheet complementary inverter according to an embodiment of the invention.

The GAA gradient-doped nano-sheet complementary inverter may apply the circuit of complementary inverter as shown in FIG. 2. The P-type FET a may be pEFT, and the N-type FET b may be nEFT. The first source area Si may connect to an electric source $V_{DD}$, the first drain area D1 may connect to the second drain area D2 to serve as an output end $V_{out}$, the second source area S2 may connect to ground and the common gate electrode 600 may serve as an input end $V_{in}$.

Besides, preferably, the P-type FET a may comprise a plurality of P-type semiconductor nano-sheet channels 301 arranged vertically, and the N-type FET b may comprise a plurality of N-type semiconductor nano-sheet channels 302 arranged vertically, to promote the performance. In the present embodiment, each transistor may correspond to upper and lower channels. However, in other embodiments, each transistor may correspond to more channels.

Here a method for making a GAA gradient-doped nano-sheet complementary inverter is introduced along with the drawings.

As shown in FIGS. 3a-3m, the method for making a GAA gradient-doped nano-sheet complementary inverter provided by the present embodiment comprises steps S1-S7.

Step S1 is providing a substrate 100. The substrate 100 may be typical bulk silicon substrate or other proper semiconductor substrate.

Figure 3A:
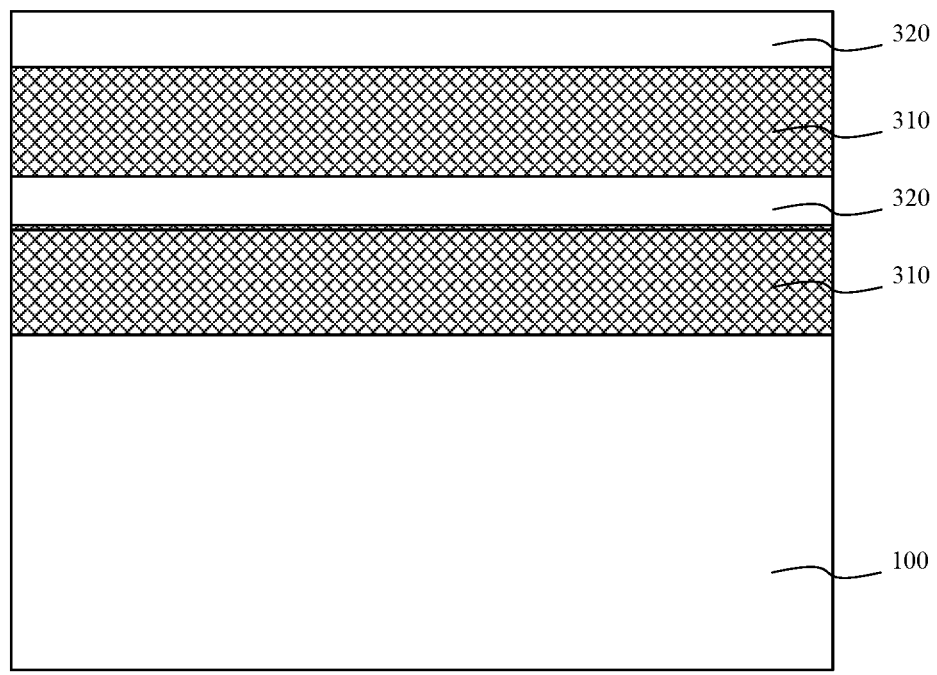
FIGS. 3a-3m show a flow chart of a method of making a GAA gradient-doped nano-sheet complementary inverter according to an embodiment of the invention.

Step S2 is forming a stack of sacrificial layer 310 and semiconductor nano-sheets 320, both of which are layered alternately, as shown in FIG. 3a.

Specifically, the stack may be formed with an epitaxial deposition process on the substrate 100. For example, the sacrificial layer 310 may be epitaxial-grown SiGe layer on the substrate 100, and then the semiconductor nano-sheets 320 may be epitaxial-grown Si layer on the sacrificial layer 310. The thickness of the sacrificial layer 310 may be 10-200 nm, and that of the semiconductor nano-sheets 320 may be 10-100 nm. In the present embodiment, two layers of sacrificial layer 310 and semiconductor nano-sheets 320 are stacked in the stack. However, in other embodiments, more layers may be applied to provide more number of channels.

Step S3 is defining at least two channel areas having different width but arranged side by side, etching the stack to form two sets of semiconductor nano-sheets 300 having different width but arranged side by side, corresponding to the two channel areas, and removing the sacrificial layer 310 underneath the semiconductor nano-sheets 300 to expose rim of the semiconductor nano-sheets 300 and suspend the semiconductor nano-sheets 300 above the substrate 100.

Figure 3B:
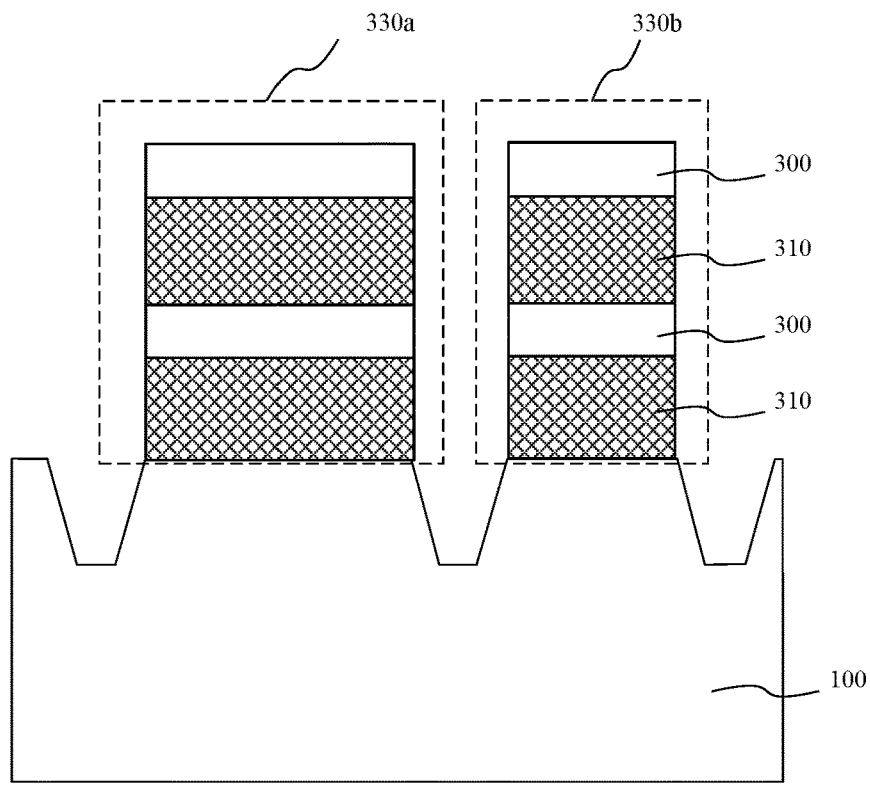

As shown in FIG. 3b, a step of forming a shallow trench isolation (STI) structure on the substrate and meanwhile defining at least two channel areas, arranged side by side, with lithography and etching processes may be performed first. For example, the two channel areas may correspond to the first channel area 330a of the P-type FET a and the second channel area 330b of the N-type FET b. The trench extends from the surface of the stack to the inner of the substrate 100. When etching the trench, two sets of semiconductor nano-sheets 300, arranged side by side, corresponding to the first channel area 330a and the second channel area 330b respectively, are formed.

Figure 3C:
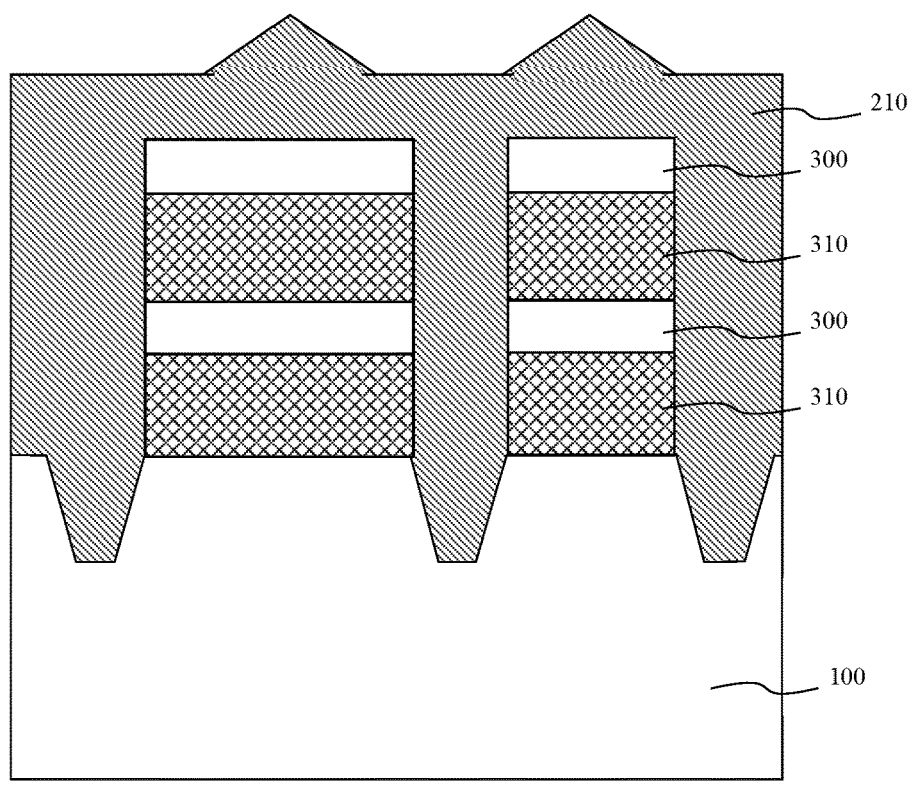
Figure 3D:
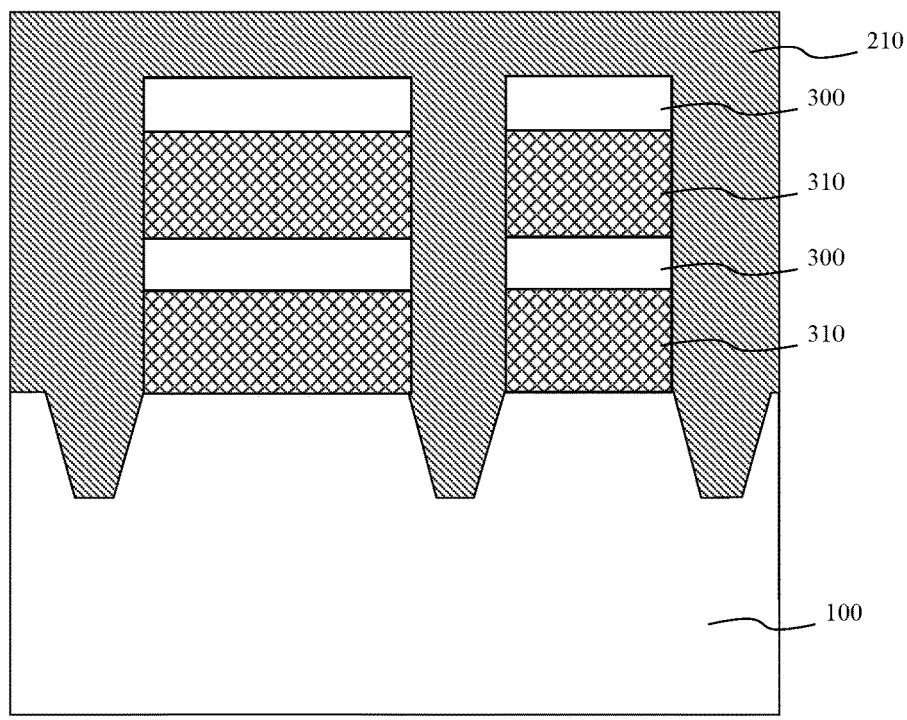
Figure 3E:
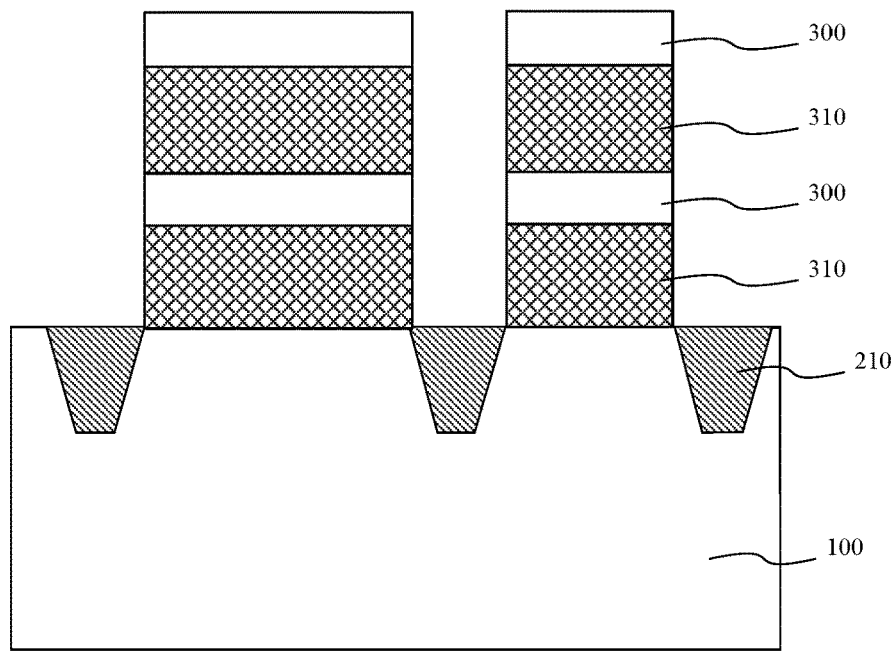

Then, as shown in FIG. 3c, insulation material 210 fills up the trench, and then as shown in FIG. 3d, CMP (chemical mechanical polish) is applied to planar the surface of the structure and avoid from residual of the material on the semiconductor nano-sheets 300. Then, as shown in FIG. 3e, with lithography and etching processes, insulating material around the first channel area 330a and the second channel area 330b is removed, and the insulating material 210 filling up the substrate 100 is kept.

Figure 3F:
Figure 3F:
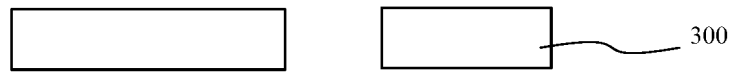
Figure 3F:
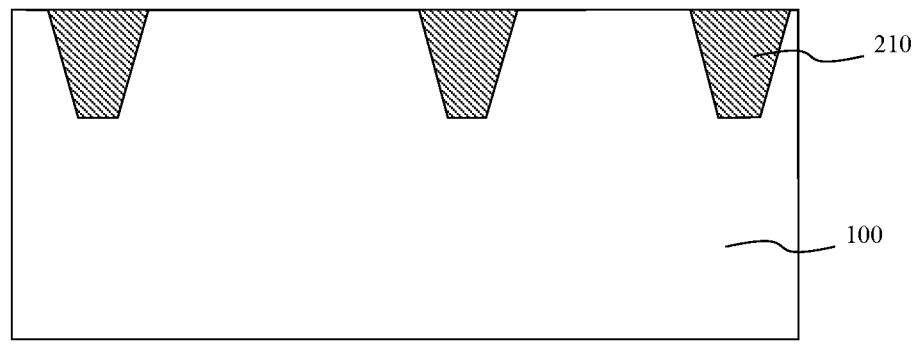

Then, anisotropic horizontal etching may be performed to remove the sacrificial layer 310 underneath the semiconductor nano-sheets 300. As shown in FIG. 3f, the surrounding of the semiconductor nano-sheets 300 may be exposed and suspended over the substrate 100. In the present embodiment, etchant comprising HF, $HNO_3$, $H_2O$ may be applied to remove the SiGe sacrificial layer 310.

Figure 3G:
Figure 3G:
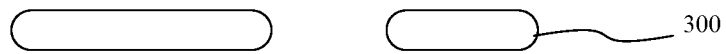
Figure 3G:
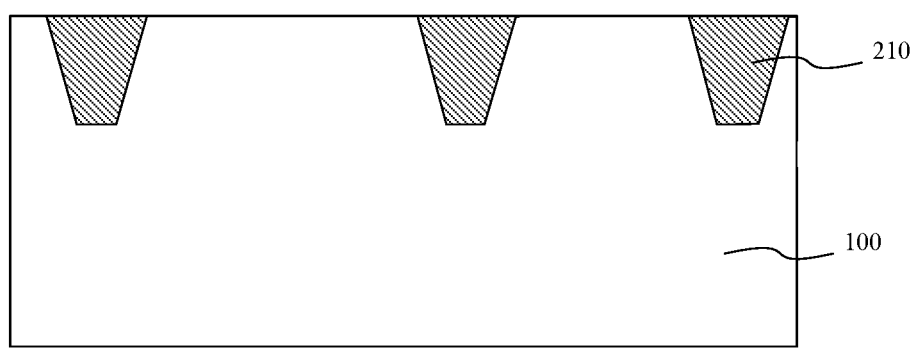

To form the cross-section profile of a track, after the sacrificial layer 310 is removed, the semiconductor nano-sheets 300 may be oxidized and then wet-etched to form rounded corners. As shown in FIG. 3g, the semiconductor nano-sheets 300 may be oxidized first, and then the oxidized layer may be removed by DHF etchant to shape the semiconductor nano-sheets 300 to be like a track roughly. Then, they may be undergone helium annealing between 800° C.-1200° C. for 5 mins to 8 hrs. Afterwards, the surface of the semiconductor nano-sheets 300 may be smoother and denser.

Step S4: doping the two sets of semiconductor nano-sheets 300 with ionized dopant respectively to form gradient-doped P-type semiconductor nano-sheet channel 301 and N-type semiconductor nano-sheet channel 302 which doping concentration is in gradient descent from the surface to the center. The wider set of semiconductor nano-sheets 300 may be used for forming the P-type semiconductor nano-sheet channel 301 and the narrower set of semiconductor nano-sheets 300 may be used for forming the N-type semiconductor nano-sheet channel 302.

Figure 3H:
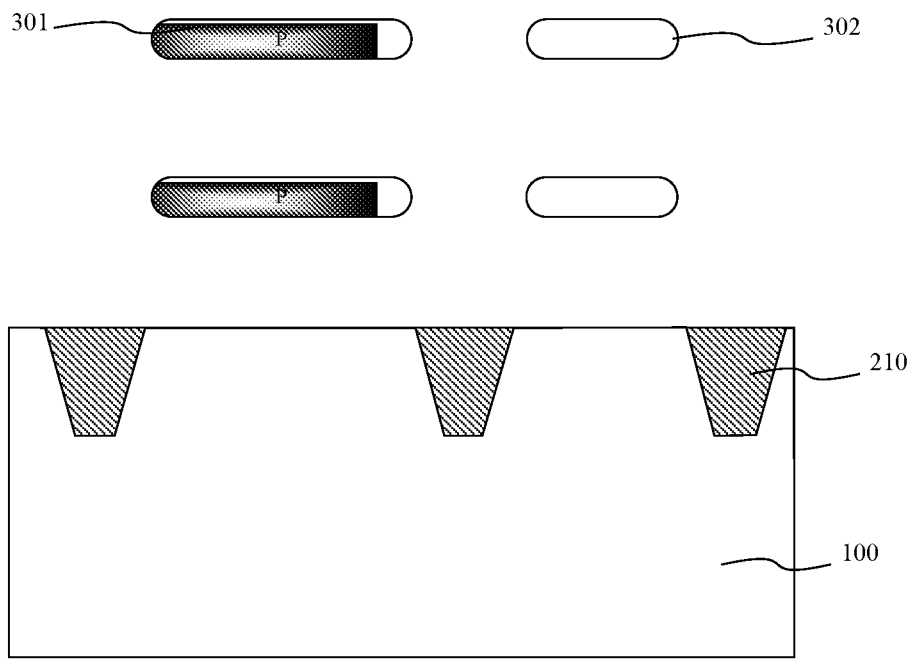
Figure 3I:
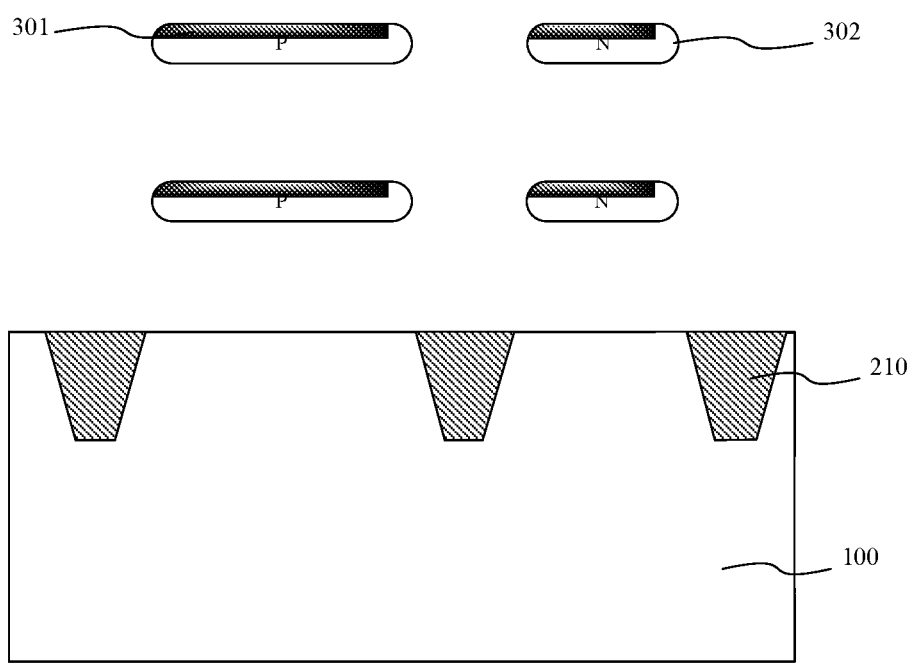

Specifically, as shown in FIG. 3h, a CVD (Chemical Vapor Deposition) or ALD (Atomic Layer Deposition) process may be performed to deposit heavily boron-doped boron-silicate glass (BSG) on the semiconductor nano-sheets 300, the BSG on the semiconductor nano-sheets 300 where is predetermined to form the N-type semiconductor nano-sheet channel 302 may be removed, an annealing and diffusing process in high temperature, such as 800° C. to 1200° C., for about 5 mins to 8 hrs may be performed to promote the diffusion of boron ion into the semiconductor nano-sheets 300, and then the BSG may be removed to form the gradient-doped P-type semiconductor nano-sheet channel 301. The doping concentration of boron ions may present the highest value at the surface of the P-type semiconductor nano-sheet channel 301 and in gradient descent from the surface to the center. A wet etching process with DHF as etchant may be performed to remove the BSG layer. Then, as shown in FIG. 3i, another CVD or ALD process may be performed to deposit heavily phosphorus-or-arsenic-doped phosphorus-silicate glass (PSG) on another set of the semiconductor nano-sheets 300, the PSG on the P-type semiconductor nano-sheet channel 301 may be removed, another annealing and diffusing process in high temperature, such as 800° C. to 1200° C., for about 5 mins to 8 hrs may be performed to promote the diffusion of phosphorus or arsenic ion into the semiconductor nano-sheets 300, and then the PSG may be removed to form the gradient-doped N-type semiconductor nano-sheet channel 302. The doping concentration of phosphorus or arsenic ions may present the highest value at the surface of the N-type semiconductor nano-sheet channel 301 and in gradient descent from the surface to the center. A wet etching process with DHF as etchant may be performed to remove the PSG layer. In the present embodiment, the gradient-doped P-type semiconductor nano-sheet channel 301 may be formed first and then the gradient-doped N-type semiconductor nano-sheet channel 302. However, in some other embodiments, the order to form the gradient-doped P-type semiconductor nano-sheet channel 301 and gradient-doped N-type semiconductor nano-sheet channel 302 may be changed.

Step S5: Forming the first gate dielectric layer 401 fully surrounding the P-type semiconductor nano-sheet channel 301 on the P-type semiconductor nano-sheet channel 301, the first gate layer 501 fully surrounding the first gate dielectric layer 401, the second gate dielectric layer 402 fully surrounding the N-type semiconductor nano-sheet channel 302 on the N-type semiconductor nano-sheet channel 302, and the second gate layer 502 fully surrounding the second gate dielectric layer 402.

Figure 3J:
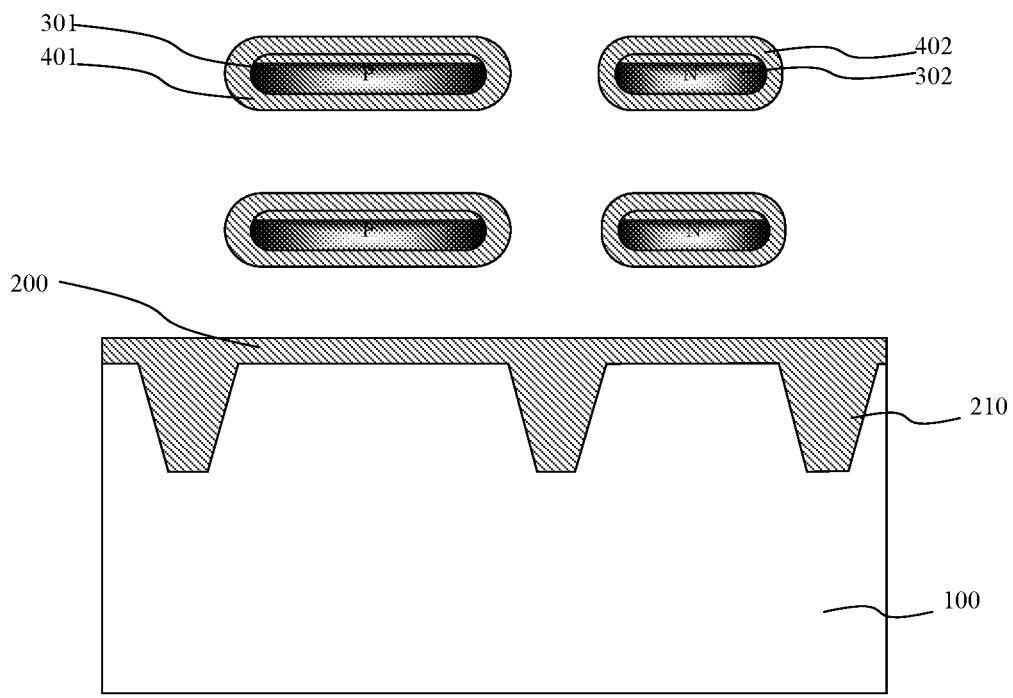

As shown in FIG. 3j, a high-k dielectric material may be deposited with a CVD or ALD process as the first gate dielectric layer 401 and second gate dielectric layer 402. During the formation of the gate dielectric layer, the insulation layer 200 may be formed on the exposed surface of the substrate 100.

Figure 3K:
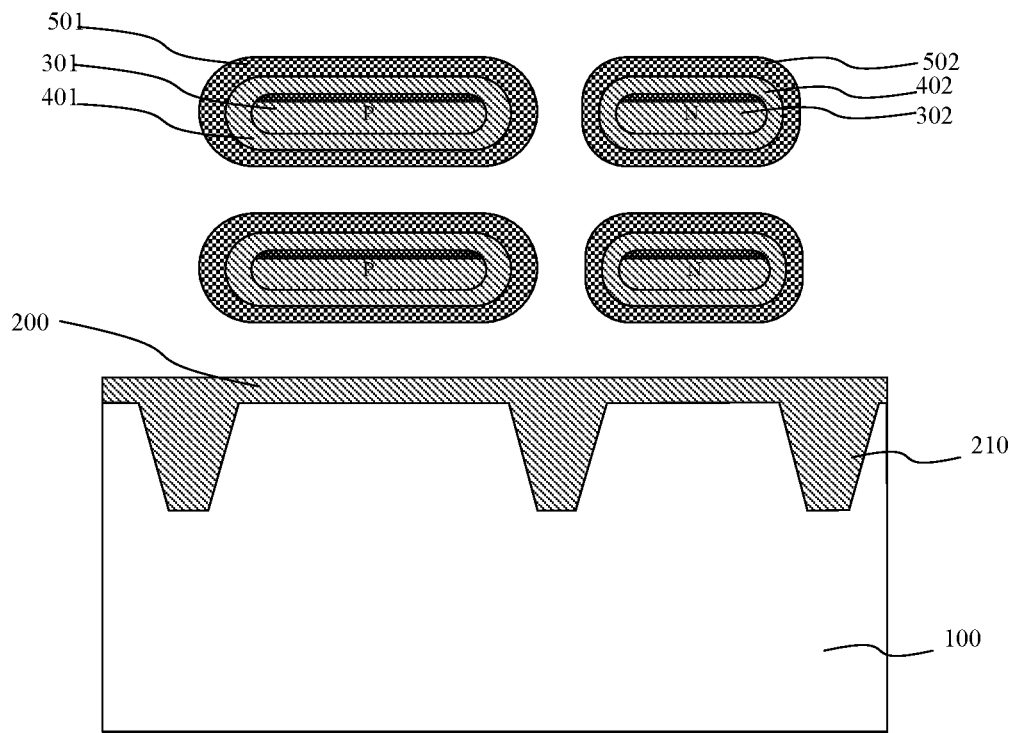

Then, as shown in FIG. 3k, a gate material may be deposited with a CVD or ALD process to form a first gate layer 501 and second first gate layer 502 on the first gate dielectric layer 401 and second gate dielectric layer 402 respectively. Specifically, the first gate layer 501 may be formed on the first gate dielectric layer 401 first, the gate material deposited on the second gate dielectric layer 402 may be removed, the second gate layer 502 may be formed on the second gate dielectric layer 402, and residual gate material on the first gate layer 501 is then removed. This means the first gate layer 501 may be formed first and then the second gate layer 502 may be formed. The gate material of the first gate layer 501 may comprise TiN, TaN, TiAl, Ti or other suitable gate materials. The gate material of the second gate layer 502 may comprise TiN, TaN, TiAl, Ti or other suitable gate materials.

Figure 3L:
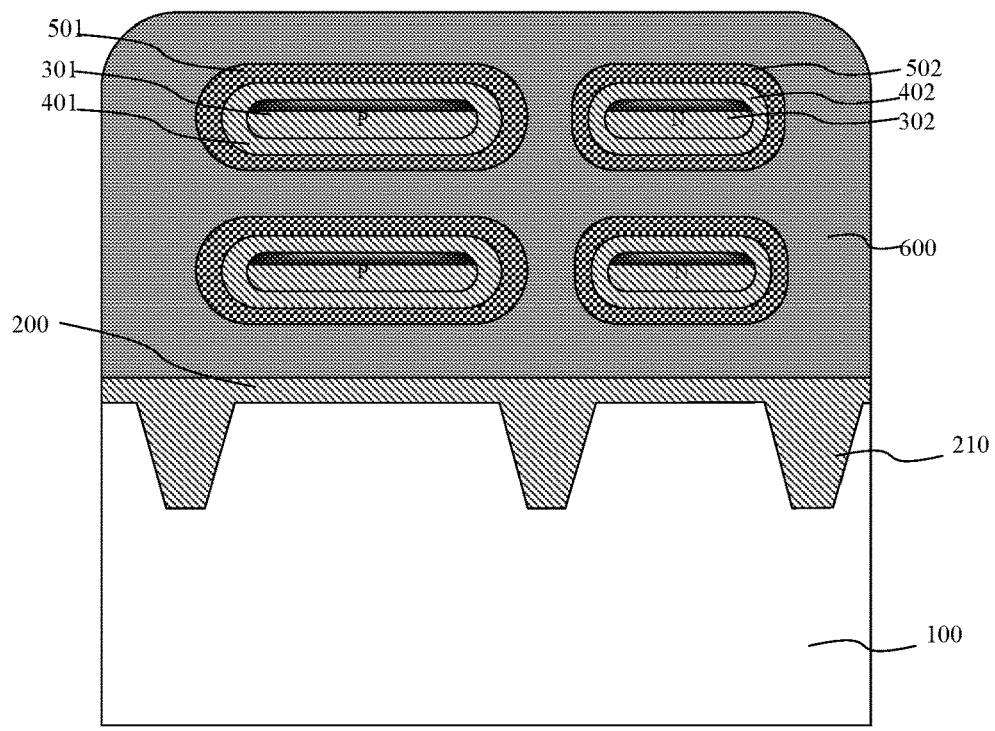

Step S6: Forming a common gate electrode 600 which fully surrounding the first gate layer 501 and the second gate layer 502 and joint them together. As shown in FIG. 3l, the material to form the common gate electrode 600 may comprise conductor such as Al, W, Cu.

Step S7: Forming a first source area S1 and a first drain area D1 at two ends of the P-type semiconductor nano-sheet channel 301 respectively and forming a second source area S2 and a second drain area D2 at two ends of the N-type semiconductor nano-sheet channel 302 respectively to finish the manufacturing of the P-type FET and the N-type FET.

Figure 3M:
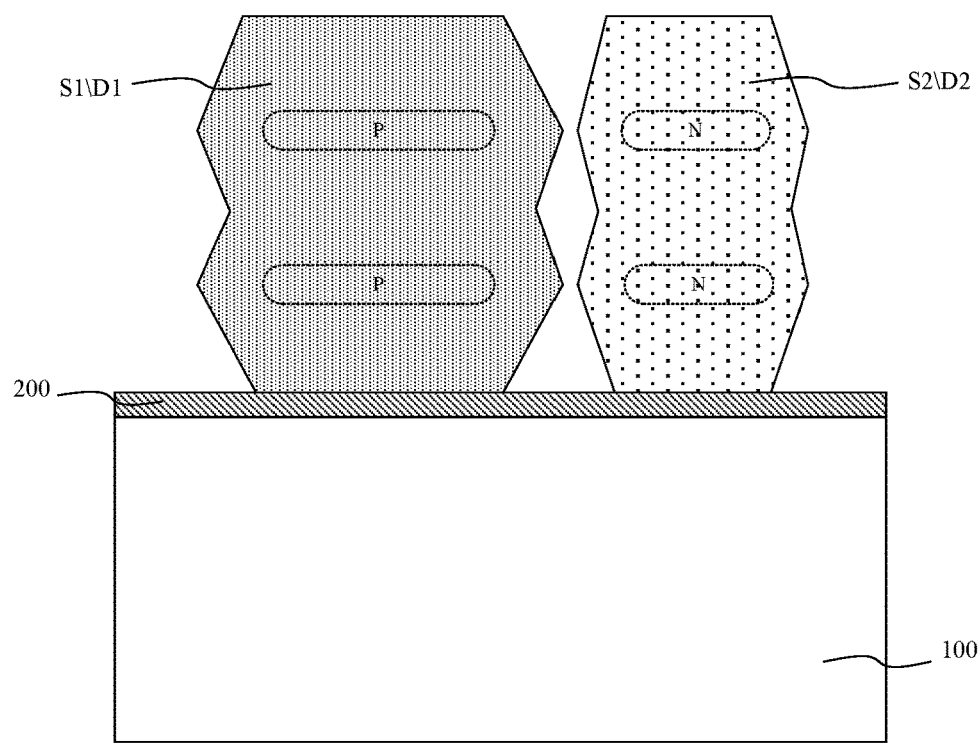

Specifically, P-type SiGe may be epitaxial-grown at two ends of the P-type semiconductor nano-sheet channel 301 respectively as the first source area S1 and first drain area D1, and N-type SiC may be epitaxial-grown at two ends of the N-type semiconductor nano-sheet channel 302 respectively as the second source area S2 and second drain area D2. FIG. 3m shows a side view of the device after the source and drain areas are formed.

Finally, as shown in FIG. 2, forming the complementary invertor a complete invertor, comprising forming wires of source and drain. Because the channels of pEFT and nEFT are arranged side by side laterally, it may be easier to connect and forming wires of the source and drain of them and form a denser component to integration.

To sum up, the present invention may provide a 3-D structure with stacked silicon nano-sheets to form a gate fully surrounding the surface of a channel, a GAA, and a common gate electrode surrounding several channels at the same time to form a denser structure. Then, with the channels of pEFT and nEFT being arranged side by side and channel width of pEFT being greater than that of nEFT, a denser and balanced invertor may carry out. The channels with gradient-doped, which doping concentration is in gradient descent from the surface to the center, may facilitate a better performance of turning-off and lower current leakage and power consumption. Further, the track-like cross-section profile of the channels may increase the cross-sectional area of the channel to increase the driving current and sustain electrical integrity at the same time. The device may show better performance and capability of shrink in size.

Compared with current device, those provided by the present invention may be denser with higher device density, better performance, more simple structure, and lower barrier to make. Therefore, the present invention overcomes various drawbacks in the current technology.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A gate-all-around (GAA) gradient-doped nano-sheet complementary inverter, comprising:
    a substrate;
    a P-type field effect transistor (FET) and an N-type FET on the substrate, the P-type FET comprising a P-type semiconductor nano-sheet channel on the substrate, a first gate dielectric layer fully surrounding the P-type semiconductor nano-sheet channel, a first gate layer fully surrounding the first gate dielectric layer, and a first source area and a first drain area arranged at two ends of the P-type semiconductor nano-sheet channel, the N-type FET comprising an N-type semiconductor nano-sheet channel on the substrate, a second gate dielectric layer fully surrounding the N-type semiconductor nano-sheet channel, a second gate layer fully surrounding the second gate dielectric layer, and a second source area and a second drain area arranged at two ends of the N-type semiconductor nano-sheet channel; and
    a common gate electrode, connecting the first gate layer and the second gate layer and fully surrounding the first gate layer and the second gate layer;
    wherein the P-type semiconductor nano-sheet channel and N-type semiconductor nano-sheet channel, arranged laterally, side by side, have a width and a length, along a horizontal direction, and a height, perpendicular to the horizontal direction, the length of the P-type semiconductor nano-sheet channel defines the distance between the first source area and the first drain area, the length of the N-type semiconductor nano-sheet channel defines the distance between the second source area and the second drain area, the width of the P-type semiconductor nano-sheet channel is greater than that of the N-type semiconductor nano-sheet channel, and a doping concentration of the P-type semiconductor nano-sheet channel and the N-type semiconductor nano-sheet channel is in gradient descent, in the height, from a surface to a center of the P-type semiconductor nano-sheet channel and the N-type semiconductor nano-sheet channel.

2. The GAA gradient-doped nano-sheet complementary inverter according to claim 1, wherein the first source area connects to a power source, the first drain area connects to the second drain area to serve as an output end, the second source area connect to ground, and the common gate electrode is served as an input end.

3. The GAA gradient-doped nano-sheet complementary inverter according to claim 1, wherein a cross-section profile of the P-type semiconductor nano-sheet channel and N-type semiconductor nano-sheet channel along with the width are like a track which comprises two semicircles at two ends and a rectangle connecting to the semicircles in the center.

4. The GAA gradient-doped nano-sheet complementary inverter according to claim 1, wherein the P-type semiconductor nano-sheet channel is applied with P-type silicon nano-sheet and the N-type semiconductor nano-sheet channel is applied with N-type silicon nano-sheet.

5. The GAA gradient-doped nano-sheet complementary inverter according to claim 1, wherein the P-type FET comprises a plurality of P-type semiconductor nano-sheet channels, arranged vertically, and the N-type FET comprises a plurality of N-type semiconductor nano-sheet channels, arranged vertically.

6. The GAA gradient-doped nano-sheet complementary inverter according to claim 1, wherein the first source area and the first drain area are applied with P-type SiGe, and the second source area and the second drain area are applied with N-type SiC.

7. The GAA gradient-doped nano-sheet complementary inverter according to claim 1, wherein a dielectric layer is formed between the first source area and the first drain area, the first gate layer and the common gate electrode, the second source area and the second drain area, and the second gate layer and the common gate electrode.

8. The GAA gradient-doped nano-sheet complementary inverter according to claim 1, wherein an insulation layer is formed under the P-type FET and the N-type FET to insulate the substrate.

* * * * *